(12) United States Patent
Hirano et al.

(10) Patent No.: US 7,706,495 B2
(45) Date of Patent: Apr. 27, 2010

(54) TWO-POINT FREQUENCY MODULATION APPARATUS

(75) Inventors: Shunsuke Hirano, Yokohama (JP); Mamoru Arayashiki, Yokohama (JP)

(73) Assignee: Panasonic Corporation, Osaka (JP)

( * ) Notice: Subject to any disclaimer, the term of this patent is extended or adjusted under 35 U.S.C. 154(b) by 698 days.

(21) Appl. No.: 11/078,701

(22) Filed: Mar. 14, 2005

(65) Prior Publication Data

US 2005/0237121 A1    Oct. 27, 2005

(30) Foreign Application Priority Data

Mar. 12, 2004    (JP)    ............................. 2004-071292

(51) Int. Cl.
 *H03D 3/24*    (2006.01)
(52) U.S. Cl. ...................... 375/373; 375/374; 375/375; 375/376
(58) Field of Classification Search ................ 375/373, 375/376
 See application file for complete search history.

(56) References Cited

U.S. PATENT DOCUMENTS

| | | | |
|---|---|---|---|
| 4,308,508 A | | 12/1981 | Sommer et al. |
| 5,068,661 A | * | 11/1991 | Kaneaki et al. ............. 341/143 |
| 5,825,253 A | * | 10/1998 | Mathe et al. .................. 331/18 |
| 5,854,599 A | * | 12/1998 | Heo et al. .................... 341/143 |
| 5,983,077 A | | 11/1999 | Dent |
| 5,986,512 A | * | 11/1999 | Eriksson ...................... 331/16 |
| 6,034,629 A | | 3/2000 | Heo |
| 6,369,731 B1 | * | 4/2002 | Takeda et al. ............... 341/143 |
| 6,373,418 B1 | * | 4/2002 | Abbey ........................ 341/143 |
| 6,515,601 B2 | * | 2/2003 | Fukuhara et al. ............ 341/131 |
| 6,538,589 B2 | * | 3/2003 | Okuda et al. ................ 341/143 |
| 6,839,012 B2 | * | 1/2005 | Kawamura .................. 341/143 |
| 6,920,182 B2 | * | 7/2005 | Bolton, Jr. ................... 375/247 |
| 7,072,626 B2 | * | 7/2006 | Hadjichristos .............. 455/126 |
| 7,126,516 B2 | * | 10/2006 | Koc et al. .................... 341/143 |
| 7,224,238 B2 | * | 5/2007 | Adachi et al. ............... 332/127 |
| 2002/0008588 A1 | * | 1/2002 | Khan ........................... 331/18 |

(Continued)

FOREIGN PATENT DOCUMENTS

JP    02-195728    8/1990

(Continued)

OTHER PUBLICATIONS

Notice of Reasons for Rejection dated May 19, 2009, on corresponding Japanese patent application with English translation.

*Primary Examiner*—Shuwang Liu
*Assistant Examiner*—Kenneth Lam
(74) *Attorney, Agent, or Firm*—Dickinson Wright PLLC

(57) ABSTRACT

A two-point frequency modulation apparatus is proposed whereby the spectrum of transmission waves is kept within the spectrum mask. Voltage is supplied to the control voltage terminal of VCO 1 in accordance with modulation data via noise shaper 101 that has operating characteristics of attenuating more noise at higher frequencies. As a result, by virtue of the working of noise shaper 101, the signal level outputted from the PLL circuit combining the modulation signal and the quantization noise decreases in proportion to the distance form the central frequency, so that two-point frequency modulation apparatus 100 is made possible whereby the spectrum of an RF modulation signal is kept within the spectrum mask.

6 Claims, 16 Drawing Sheets

U.S. PATENT DOCUMENTS

| | | | |
|---|---|---|---|
| 2003/0025565 A1* | 2/2003 | Takeda et al. | 331/100 |
| 2003/0043950 A1* | 3/2003 | Hansen et al. | 375/376 |
| 2003/0174026 A1* | 9/2003 | Adachi et al. | 332/117 |
| 2004/0196924 A1 | 10/2004 | Wilson | |
| 2007/0054629 A1* | 3/2007 | Maligeorgos et al. | 455/88 |

FOREIGN PATENT DOCUMENTS

| | | |
|---|---|---|
| JP | 5-244009 | 9/1993 |
| JP | 05-506338 | 9/1993 |
| JP | 6-085688 | 3/1994 |
| JP | 8-102670 | 4/1996 |
| JP | 10-022830 | 1/1998 |
| JP | 10-107639 | 4/1998 |
| JP | 11-274937 | 10/1999 |
| JP | 2000-004121 | 1/2000 |
| JP | 2001-512912 | 8/2001 |
| JP | 2001-517013 | 10/2001 |
| JP | 2002-076901 | 3/2002 |
| JP | 2003-510899 | 3/2003 |
| JP | 2003-229769 | 8/2003 |
| JP | 2003-273651 | 9/2003 |
| WO | 91/07824 | 5/1991 |
| WO | 99/07065 | 2/1999 |
| WO | 99/14859 | 5/1999 |

* cited by examiner

300: WIRELESS TRANSMISSION APPARATUS

400: WIRELESS COMMUNICATION APPARATUS

TWO-POINT FREQUENCY MODULATION APPARATUS

BACKGROUND OF THE INVENTION

1. Field of the Invention

The present invention relates specifically to a frequency modulation apparatus, polar modulation transmission apparatus, wireless transmission apparatus, and wireless communication apparatus that perform frequency modulation by utilizing the PLL (Phase Locked Loop).

2. Description of the Related Art

Heretofore, frequency modulation apparatuses utilizing the PLL have been widely used to modulate carrier signals with baseband modulation signals and form transmission signals (that is, to up-convert baseband modulation signals to radio frequency). Generally, frequency modulation apparatuses of this type are expected to realize low costs, low power consumption, excellent noise characteristics, and high modulation accuracy. To modulate signals using the PLL, and, in particular, to improve modulation accuracy using the PLL, the PLL frequency bandwidth (i.e. PLL bandwidth) is preferably wider than the frequency bandwidth of the modulation signal (i.e. modulation bandwidth).

However, widening the PLL bandwidth has the risk of deteriorating noise characteristics. So, the technology called "two-point modulation" is presently proposed whereby the PLL bandwidth is set narrower than the modulation bandwidth and the modulation in the PLL bandwidth and the modulation outside the PLL bandwidth are performed at two different points (see, for example, U.S. Pat. No. 4,308,508).

FIG. 1 shows the configuration of a frequency modulation apparatus utilizing a conventional two-point modulation PLL. Frequency modulation apparatus 10 has: a voltage controlled oscillator (VCO) 1 that changes the oscillation frequency in accordance with the voltage in the control voltage terminal; frequency divider 2 that divides the frequency of an RF modulation signal outputted from VCO 1; phase comparator 3 that compares the phase of the output signal of frequency divider 2 and the phase of the reference signal and outputs a signal in accordance with the phase difference between the two signals; and loop filter 4 that averages the output signals of phase comparator 3 and outputs the result. Frequency modulation apparatus 10 adds modulation data generated in modulation signal generator 5 to carrier frequency data and supplies the result as the frequency division ratio in frequency divider 2, thereby performing modulation at the first point.

In addition, frequency modulation apparatus 10 is designed to convert the modulation data into analogue voltage in digital-to-analogue (D/A) convertor 6, suppress the aliasing noise in the output of D/A convertor 6 by means of post filter 7 and thereafter add the result to the output of loop filter 4 and supply this result to the control voltage terminal of VCO 1, thereby performing modulation at the second point.

Thus, the use of the two-point frequency modulation technology such as described above makes it possible to output wideband RF modulation signals that stretch outside the PLL bandwidth, even when the PLL bandwidth is set narrower than the modulation bandwidth. As a result, the deterioration of noise characteristics due to the PLL is suppressed.

First, assuming a case using two-point modulation, frequency characteristics will be described below. FIG. 2 shows frequency characteristics in baseband area for explanation of the operation of a two-point modulation PLL. In this drawing, H(s) is a transfer function that indicates the frequency characteristics of the PLL, where s=jω. H(s) has low pass characteristics, such as shown in FIG. 2. The modulation signal added to the frequency division ratio set in frequency divider 2 is low pass filtered by the transfer function H(s) by the PLL. On the other hand, the modulation signal outputted from post filter 7 is added to the control voltage terminal of VCO 1 and thereby high pass filtered by the transfer function 1−H(s), such as shown in FIG. 2. That is, if the modulation data is Φ(s), the baseband component in the RF modulation signal outputted from VCO 1 bears no relationship to the frequency characteristics of the PLL as represented by the following formula:

$$H(s)\Phi(s)+\{1-H(s)\}\Phi(s)=\Phi(s) \tag{1}$$

Applying two-point modulation thus to the PLL makes it possible to output wideband RF modulation signals that stretch outside the PLL bandwidth, from VCO 1. Incidentally, fs is the sampling frequency (i.e. the operation frequency of D/A convertor 6).

Now, the output of D/A convertor 6 contains quantization noise such as shown in FIG. 2. suppressing this quantization noise is required from post filter 7. Post filter 7 has low pass characteristics, such as shown in FIG. 2. When the bandwidth is too narrow, this suppresses the modulation signal shown in FIG. 2. On the other hand, although widening the bandwidth too much makes it possible to avoid adversely affecting the modulation signal, this in turn makes it difficult to suppress noise enough including quantization noise.

FIG. 3 illustrates the spectrum of RF modulation signal that appears in the output of VCO 1. Quantization noise is superimposed upon the modulation signal and the resulting waveform is outputted from VCO 1. Quantization noise is suppressed near the center frequency ($f_{VCO}$), by virtue of the characteristics of 1−H(s) shown in FIG. 2. Likewise, quantization noise is suppressed far from $f_{VCO}$, by virtue of the frequency characteristics of post filter 7.

Now, for example, the GSM (Global System for Mobile Communications) standard stipulates that the spectrum of transmission waves is not to be out of the spectrum mask such as shown by the dotted line in the drawing.

Nevertheless, according to the conventional two-point frequency modulation apparatus, the spectrum of transmission waves might go beyond the spectrum mask due to the influence of quantization noise, such as shown in FIG. 3.

SUMMARY OF THE INVENTION

It is therefore an object of the present invention to provide a two-point frequency modulation apparatus, polar modulation transmission apparatus, wireless transmission apparatus, and wireless communication apparatus whereby the spectrum of transmission waves is kept within the spectrum mask.

To achieve the above-stated object of the present invention, in accordance with one aspect of the present invention, there is provided a frequency modulation apparatus comprising: a PLL circuit; a frequency divider that is provided in the PLL circuit and determines a frequency division ratio in the PLL circuit based on a baseband modulation signal and a carrier frequency signal; an adder that is provided in the PLL circuit between a loop filter and a voltage controlled oscillator and adds voltage according to the baseband modulation signal to output voltage of the loop filter and supplies the output voltage of the loop filter to a control voltage terminal of the voltage controlled oscillator; and a noise shaper that changes frequency characteristics of quantization noise that appears when the baseband modulation signal is analogue converted and supplied to the adder.

Also, to achieve the above-stated object of the present invention, in accordance with another aspect of the present invention, there is provided a polar modulation transmission apparatus comprising: an amplitude phase convertor that forms a baseband phase modulation signal and a baseband amplitude modulation signal on the based on a baseband modulation signal; a PLL circuit that receives as input the baseband phase modulation signal and outputs an RF phase modulation signal; a high frequency power amplifier that changes an amplitude of the RF phase modulation signal outputted from a voltage controlled oscillator of the PLL circuit in accordance with the amplitude modulation signal; a frequency divider that is provided in the PLL circuit and sets a frequency division ratio in the PLL circuit based on the baseband phase modulation signal and a carrier frequency signal; an adder that is provided in the PLL circuit between a loop filter and a voltage controlled oscillator and adds voltage according to the baseband modulation signal to output voltage of the loop filter and supplies the output voltage of the loop filter to a control voltage terminal of the voltage controlled oscillator; and a noise shaper that changes frequency characteristics of quantization noise that appears when the baseband modulation signal is analogue converted and supplied to the adder.

Furthermore, to achieve the above-stated object of the present invention, there are provided a wireless transmission apparatus and a wireless communication apparatus comprising the frequency modulation apparatus of the above configuration. By this means, the wireless transmission apparatus and wireless communication apparatus are able to perform two-point frequency modulation of high accuracy, thereby obtaining high quality transmission signals, dependably keeping transmission waves within the spectrum mask and suppressing interference against other wireless equipments.

BRIEF DESCRIPTION OF THE DRAWINGS

The above and other objects and features of the invention will appear more fully hereinafter from a consideration of the following description taken in connection with the accompanying drawings, in which.

DETAILED DESCRIPTION OF PREFERRED EMBODIMENTS

Now, embodiments of the present invention will be described below in detail with reference to the accompanying drawings.

Embodiment 1

Figure 1:
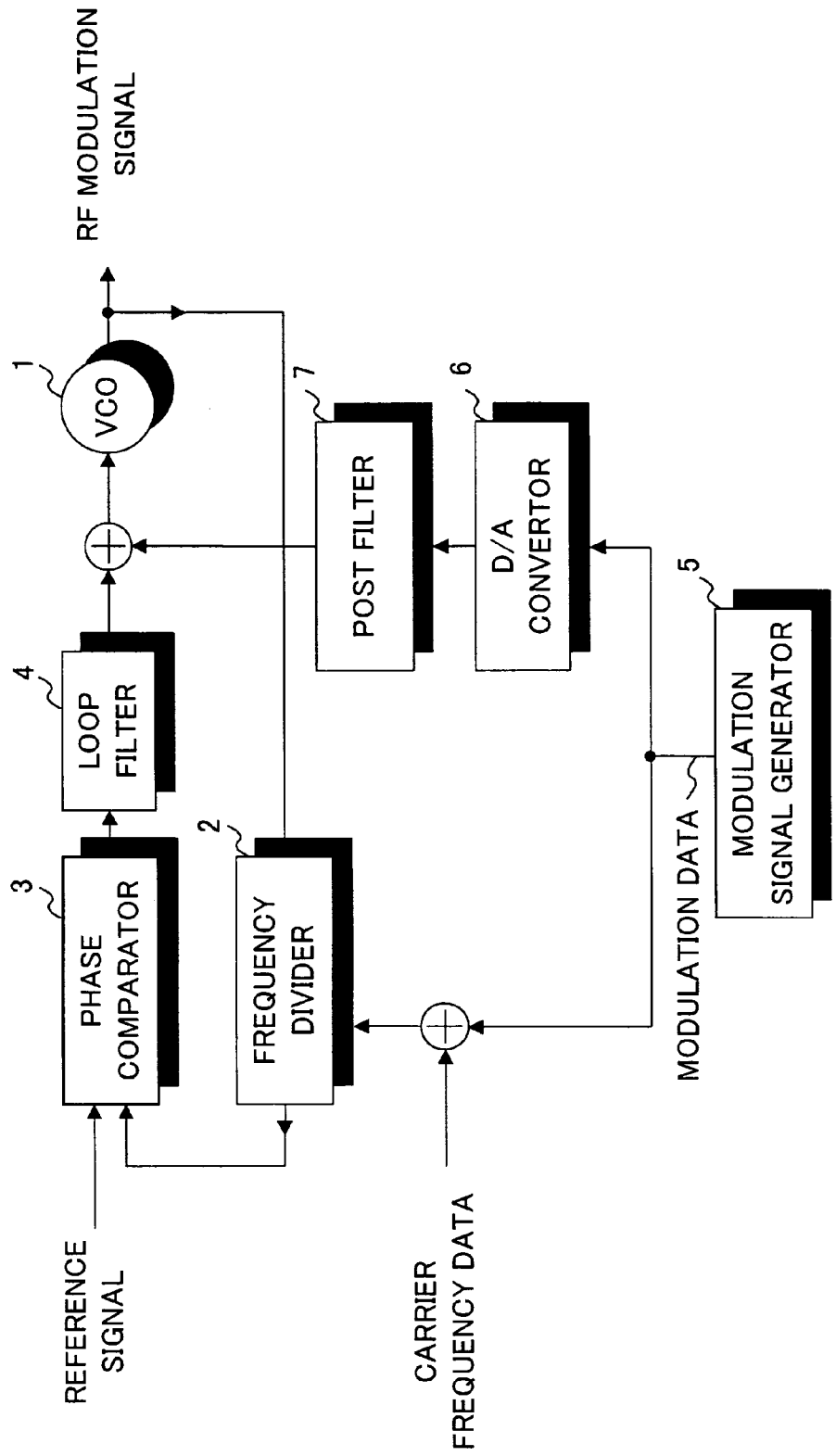
FIG. 1 is a block diagram showing a configuration of a conventional two-point frequency modulation apparatus.
Figure 4:
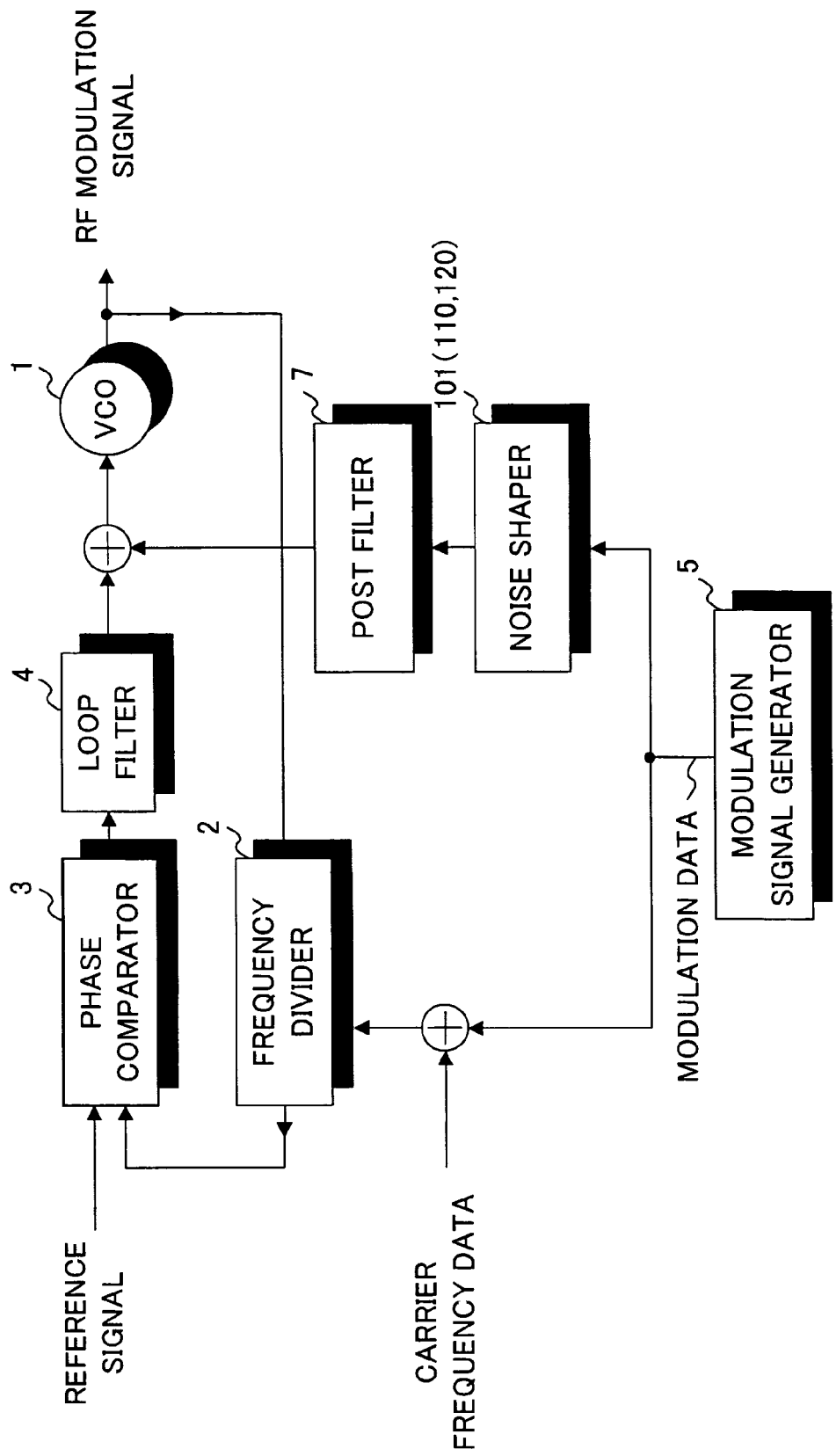
FIG. 4 is a block diagram showing a configuration of a frequency modulation apparatus according to Embodiment 1 of the present invention.

FIG. 4 shows the configuration of the two-point frequency modulation apparatus according to Embodiment 1 of the present invention, wherein parts that are identical to those in FIG. 1 are assigned the same reference numerals as in FIG. 1. In comparison to frequency modulation apparatus 10 of FIG. 1, frequency modulation apparatus 100 of FIG. 4 has noise shaper 101 instead of D/A convertor 6.

Noise shaper 101 has the function of shaping analogue voltage values in accordance with modulation data (i.e. digital baseband modulation signals) and the function of changing the frequency characteristics of the quantization noise that appears then.

Figure 5:
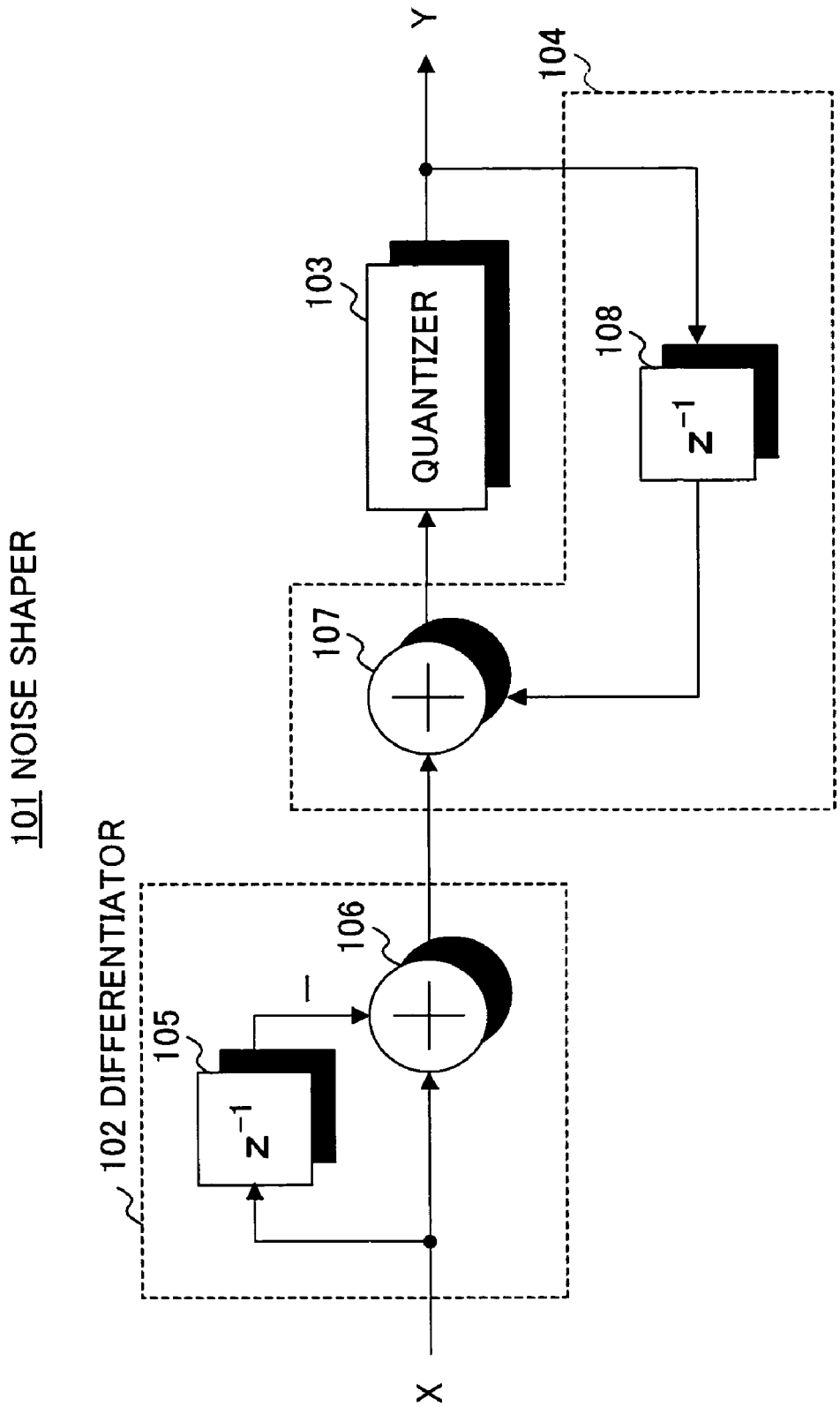
FIG. 5 is a block diagram showing a configuration of a noise shaper according to Embodiment 1.

Noise shaper 101 of this embodiment is configured as shown in FIG. 5. In this FIG. 5, X represents modulation data and Y represents analogue output voltage. Noise shaper 101 has, roughly, differentiator 102 that differentiates modulation data; quantizer 103; and feedback circuit 104 that synchronizes the timing of the output signal of differentiator 102 and the output signal of quantizer 103 (that is, analogue output voltage Y), adds these output signals, and inputs the result in quantizer 103.

Differentiator 102 subtracts input signal X, which is delayed by $Z^{-1}$ in delay element 105 (that is, delayed by one operation clock of noise shaper 101), and present input signal X in substractor 106, and obtains the differentiation output. Incidentally, "z" indicates the Z transform. This differentiation output is inputted in quantizer 103 via adder 107.

Quantizer 103 quantizes the input signal at a sampling frequency at least double the sampling frequency of modulation data X and obtains analogue output voltage Y. In fact, quantizer 103 is designed to perform quantization at a sampling frequency several tens of times the sampling frequency of modulation data X and obtain analogue output voltage Y. The output of quantizer 103 is sent to adder 107 via delay element 108 that delays the output by the time of $Z^{-1}$.

Next, the operation and characteristics of noise shaper 101 and frequency modulation apparatus 100 will be described. The transfer function of differentiator 102 can be expressed as $(1-z^{-1})$. Now, if the quantization noise that appears in quantizer 103 is Q, the relationship between modulation data X and analogue output voltage Y can be represented by the following formula:

$$Y=(1-z^{-1})X+z^{-1}y+Q \qquad (2)$$

An expansion of formula (2) gives the following formula:

$$Y=X+Q/(1-z^{-1}) \qquad (3)$$

In formula (3), $1/(1-z^{-1})$ that is multiplied upon quantization noise Q is the transfer function of the integration. That is, quantization noise that is integrated is added to input signal X and the result is the output. The frequency characteristics of integration have low pass characteristics.

Figure 2:
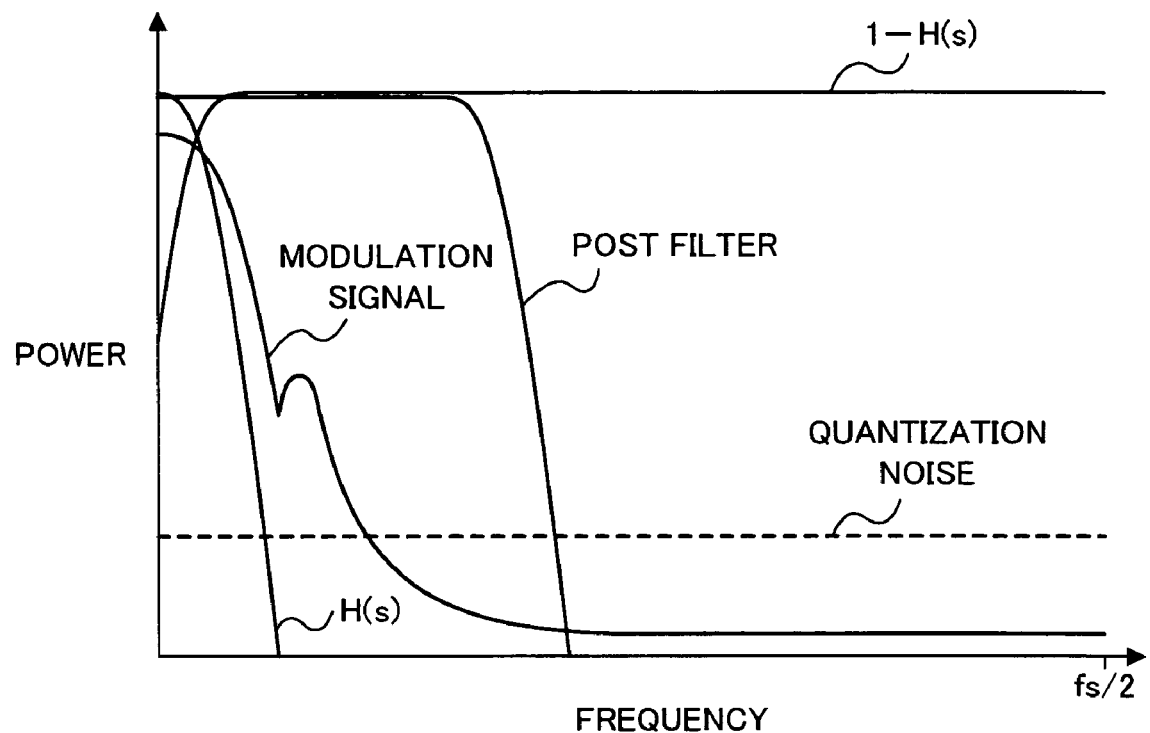
FIG. 2 shows a characteristic curve of baseband signal spectrum in the conventional two-point frequency modulation apparatus.
Figure 6:
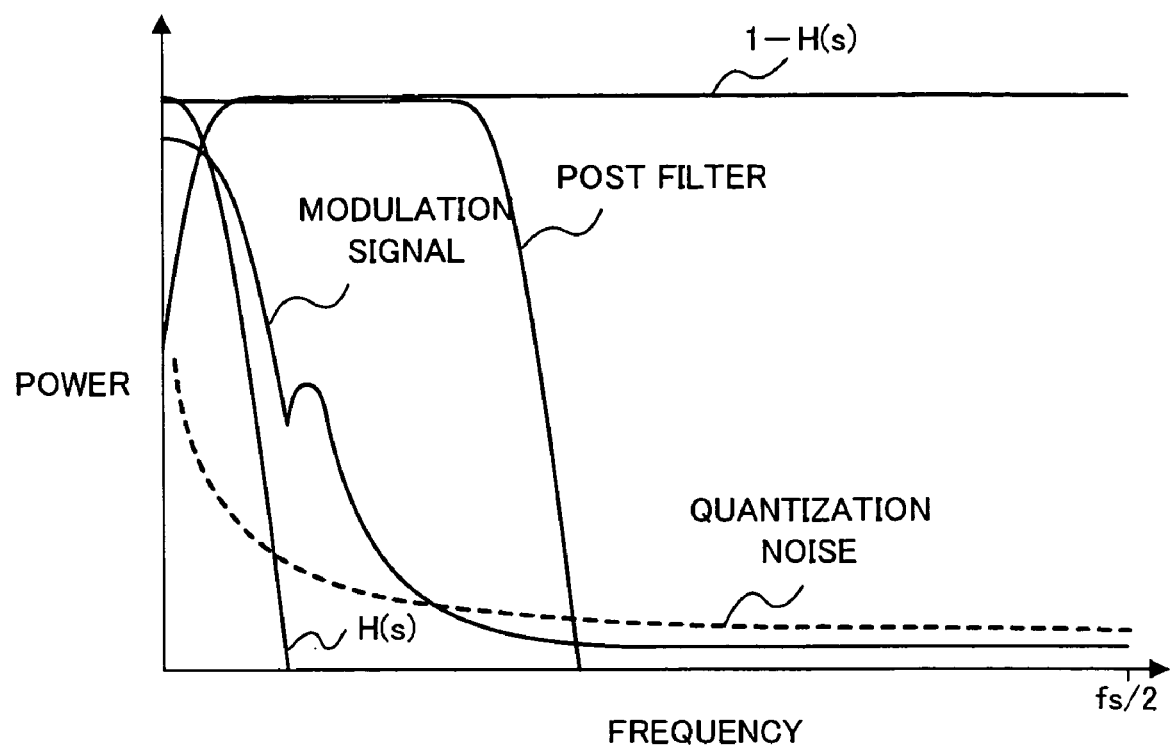
FIG. 6 shows a characteristic curve of baseband signal spectrum according to Embodiment 1.

FIG. 6 shows frequency characteristics of baseband area according to frequency modulation apparatus 100. In comparison to FIG. 2, the distribution of quantization noise Q is different. This is in accordance with the frequency characteristics of the integration $1/(1-z^{-1})$ in formula (3). By this means, quantization noise Q becomes infinite at DC (i.e. 0 Hz). However, after this, high pass characteristics of {1−H (s)} are applied, and, consequently, noise is suppressed near DC.

To be more specific, increasing the order of the PLL makes the slope of the attenuation of {1−H(s)} steeper, and so the order of the PLL should be set such that the increase of quantization noise near DC in FIG. 6 is eliminated. Alternatively, it is also possible to increase the cutoff frequency of the PLL and increase the level of attenuation of {1−H(s)} near DC, thereby suppressing noise near DC.

Figure 3:
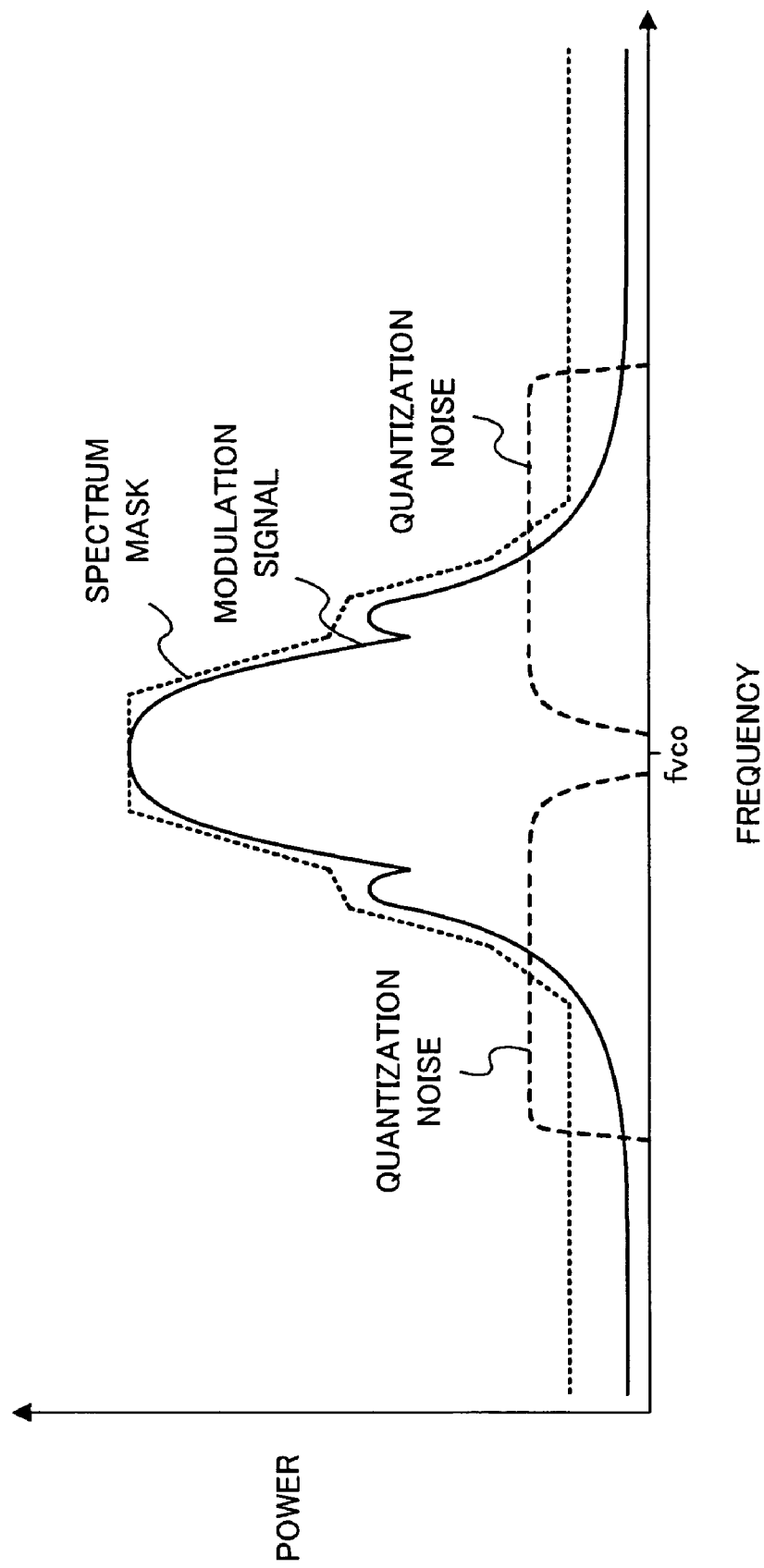
FIG. 3 shows a characteristic curve of RF signal spectrum in the conventional two-point frequency modulation apparatus.
Figure 7:
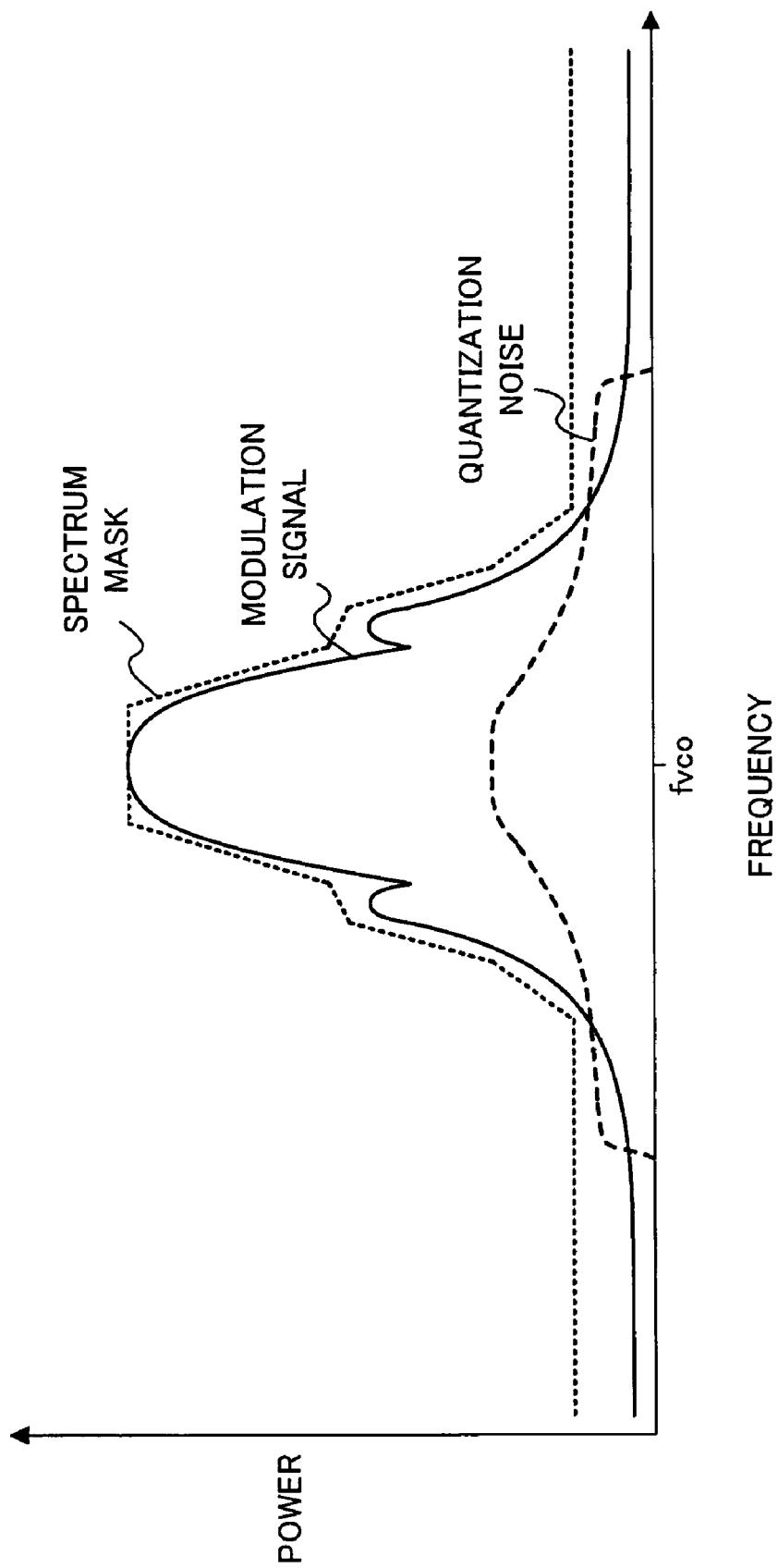
FIG. 7 shows a characteristic curve of RF signal spectrum according to Embodiment 1.

FIG. 7 shows the spectrum of an RF modulation signal outputted from VCO 1. Quantization noise Q is superimposed upon the modulation signal, and the resulting waveform is outputted from VCO 1. As shown in FIG. 7, compared to FIG. 3, quantization noise Q that is superimposed upon the modulation signal has lower levels of noise at far points from the center frequency, by the working of noise shaper 101. This fulfills the requirement of the spectrum mask.

According to the present embodiment, thus, modulation data is supplied to an adder provided before VCO 1 such that the frequency characteristics of the quantization noise in the modulation data that results from analogue conversion of the modulation data are changed thorough noise shaper 101 having operating characteristics of attenuating more quantization noise at higher frequencies. Consequently, two-point frequency modulation apparatus 100 of the present embodiment makes it possible to keep the spectrum of transmission waves (RF modulation signals) within the spectrum mask.

Although a case has been described above with this embodiment where noise shaper 101 has an order of degree one, it is equally possible to set an order of degree two and greater in noise shaper 101. In addition, the configuration of noise shaper 101 is by no means limited to the one shown in FIG. 5, and any configuration having characteristics of attenuating more quantization noise at higher frequencies is applicable. Moreover, although the configuration of frequency divider 2 was not described above in detail with the present embodiment, the fractional type that is commonly known is preferable. This applies to the following embodiments as well.

Embodiment 2

Figure 8:
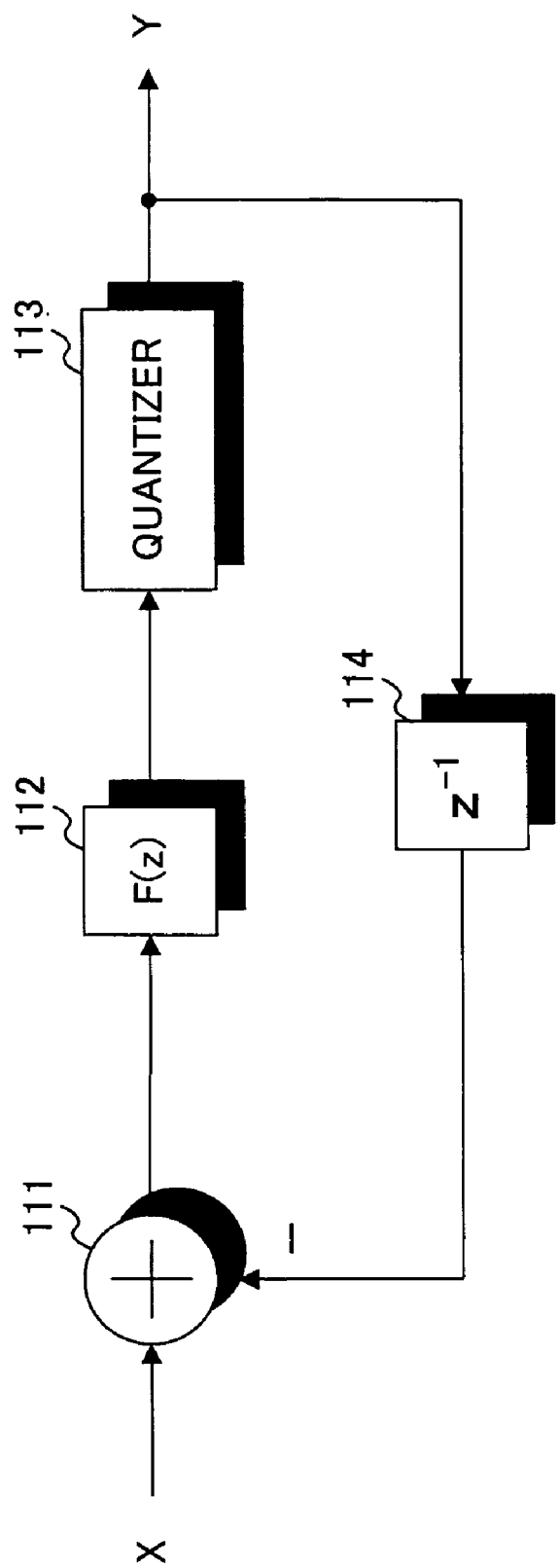
FIG. 8 is a block diagram showing a configuration of a noise shaper according to Embodiment 2 of the present invention.

The present embodiment proposes the use of a bandpass delta sigma modulator having the configuration shown in FIG. 8 as a noise shaper. Noise shaper 110 is used in frequency modulation apparatus 100 in place of noise shaper 101 of FIG. 1.

Similar to noise shaper 101 of Embodiment 1, noise shaper 110 has the function of shaping analogue voltage values in accordance with modulation data and the function of changing the frequency characteristics of the quantization noise that appears then. However, the method of changing the frequency characteristics of quantization noise is different from that of Embodiment 1.

Figure 9:
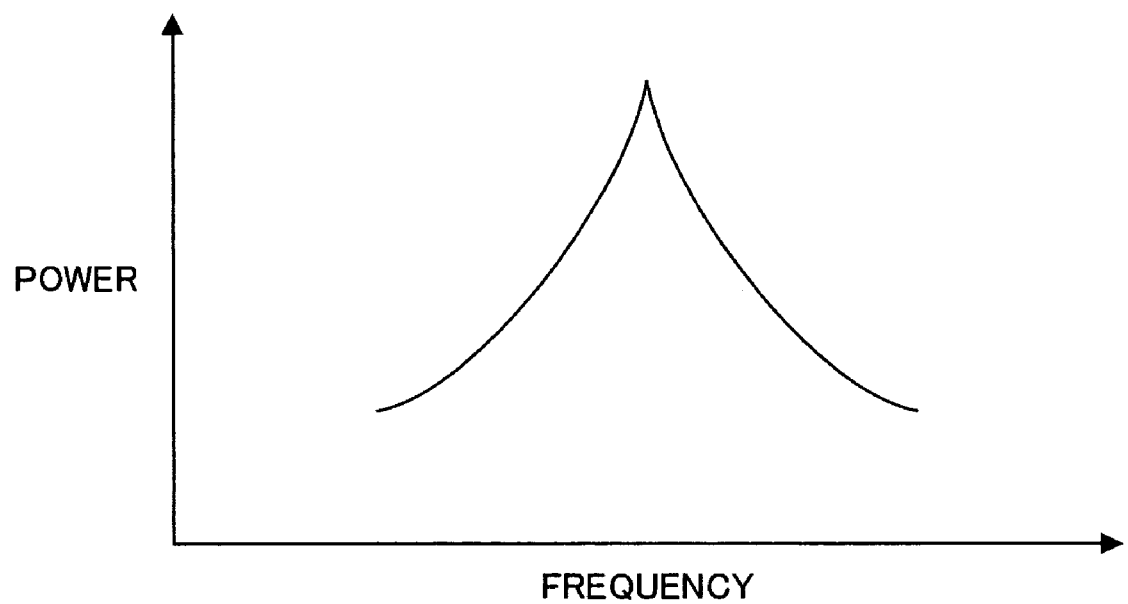
FIG. 9 shows a characteristic curve of transfer function F(z) according to Embodiment 2.

Noise shaper 110 inputs modulation data in subtractor 111 and inputs the subtraction result in filter (F(z)) 112 having oscillation characteristics such as shown in FIG. 9. The filter output is quantized in quantizer 113 and thereby becomes analogue output voltage Y. Furthermore, analogue output voltage Y is delayed in delay element 114 by $z^{-1}$ and thereafter fed back as the subtraction input of subtractor 111.

Next, the operation and characteristics of noise shaper 110 and frequency modulation apparatus using noise shaper 110 will be described.

Now, if the quantization noise that appears in quantizer 113 is Q, the relationship between modulation data X and analogue output voltage Y can be represented by the following formula:

$$Y=X+Q/F(z) \qquad (4)$$

$1/F(z)$ that is multiplied upon quantization noise Q is a transfer function of a notch. That is, quantization noise Q including a notch is added to input signal X and the result is the output.

Figure 10:
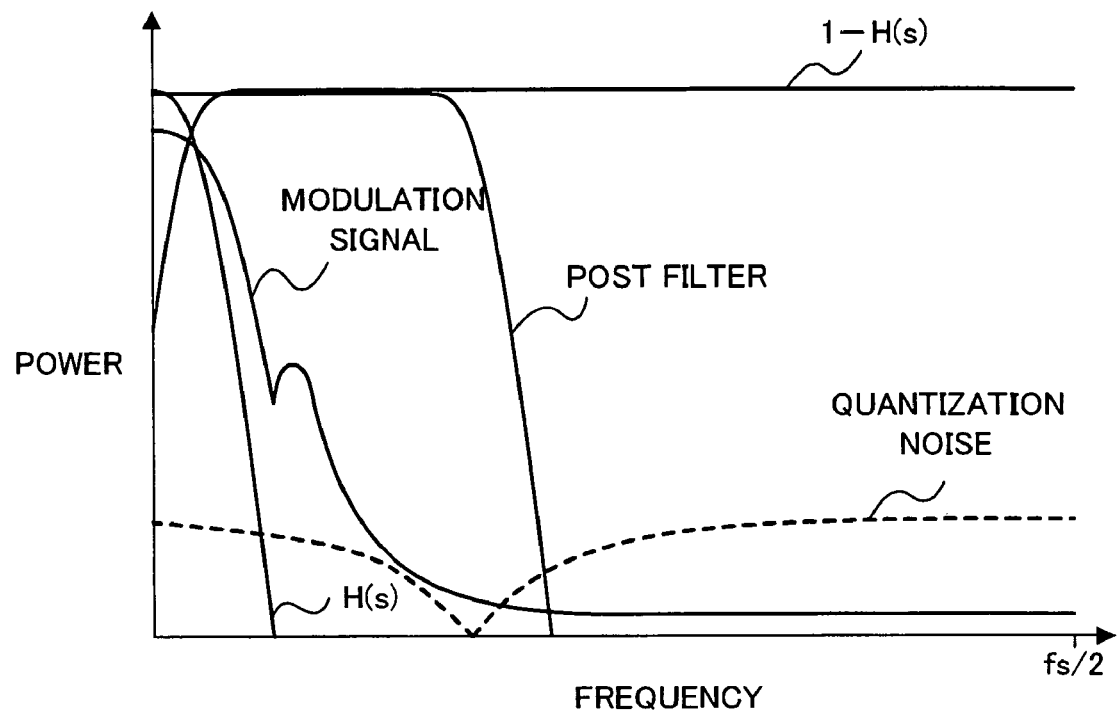
FIG. 10 shows a characteristic curve of baseband signal spectrum of Embodiment 2.

FIG. 10 shows frequency characteristics in baseband area of frequency modulation apparatus 100 using noise shaper 110 of the present embodiment. In comparison to FIG. 2, the distribution of quantization noise Q is different. This is in accordance with the frequency characteristics of the notch $1/F(z)$ in formula (4). Preferably, the notch is set within the bandwidth of post filter 7 having bandpass (low pass) filter characteristics and set at frequencies where noise outside the modulation bandwidth can be suppressed.

Figure 11:
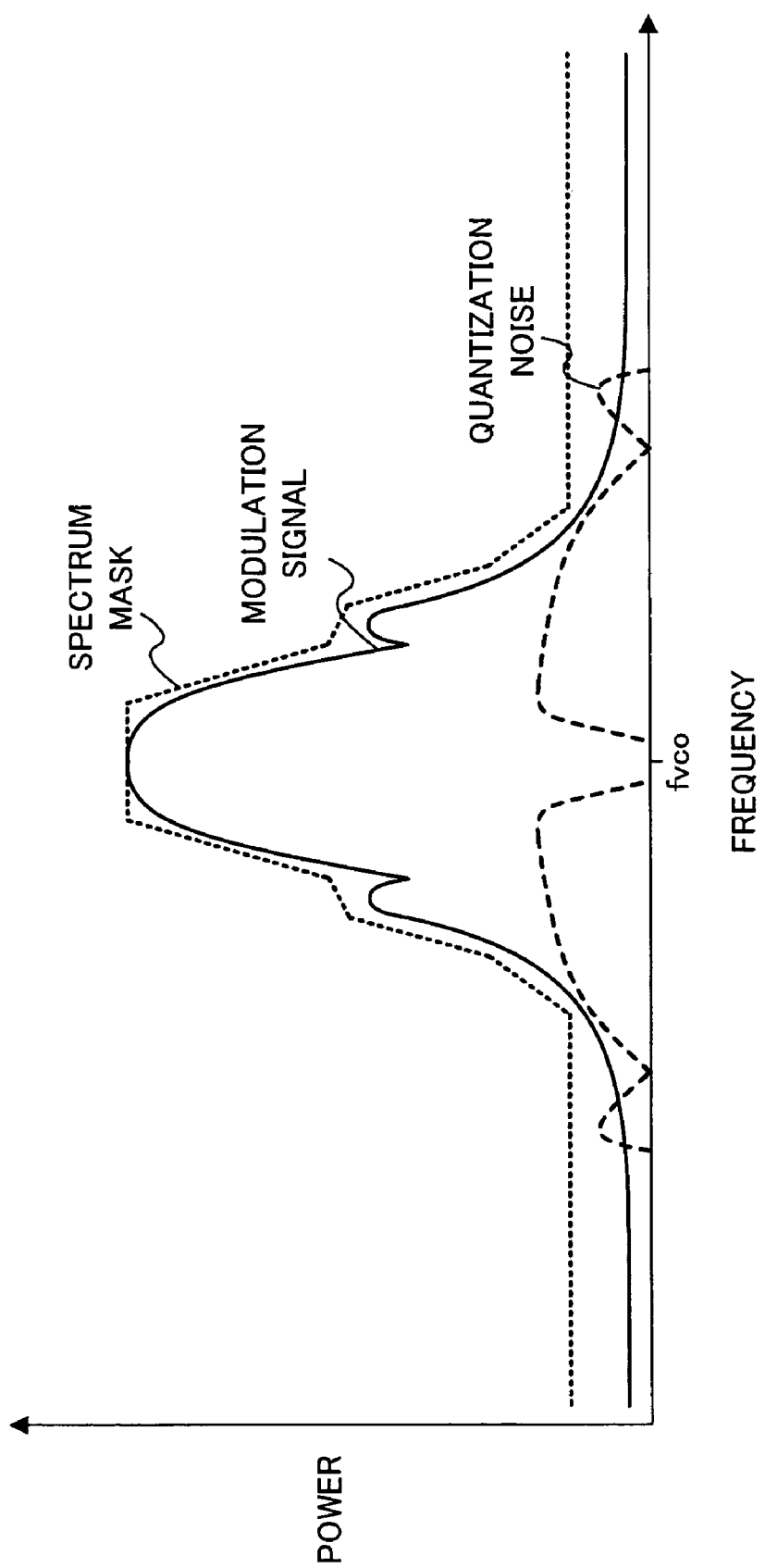
FIG. 11 shows a characteristic curve of RF signal spectrum according to Embodiment 2.

FIG. 11 shows the spectrum of RF modulation signal outputted from VCO 1. Quantization noise Q is superimposed upon the modulation signal, and the resulting waveform is outputted from VCO 1. As shown in FIG. 11, compared to FIG. 3, quantization noise Q that is superimposed upon the modulation signal has lower noise levels at far points from center frequency $f_{VCO}$, by the working of the notch effect of noise shaper 101. This fulfills the requirement of the spectrum mask.

According to the present embodiment, thus, voltage in accordance with modulation data is supplied to the control voltage terminal of VCO1 via noise shaper 110, which is comprised of a bandpass delta sigma modulator configuration. Consequently, two-point frequency modulation apparatus 100 of the present embodiment makes it possible to keep the spectrum of transmission waves within the spectrum mask.

Embodiment 3

Figure 12:
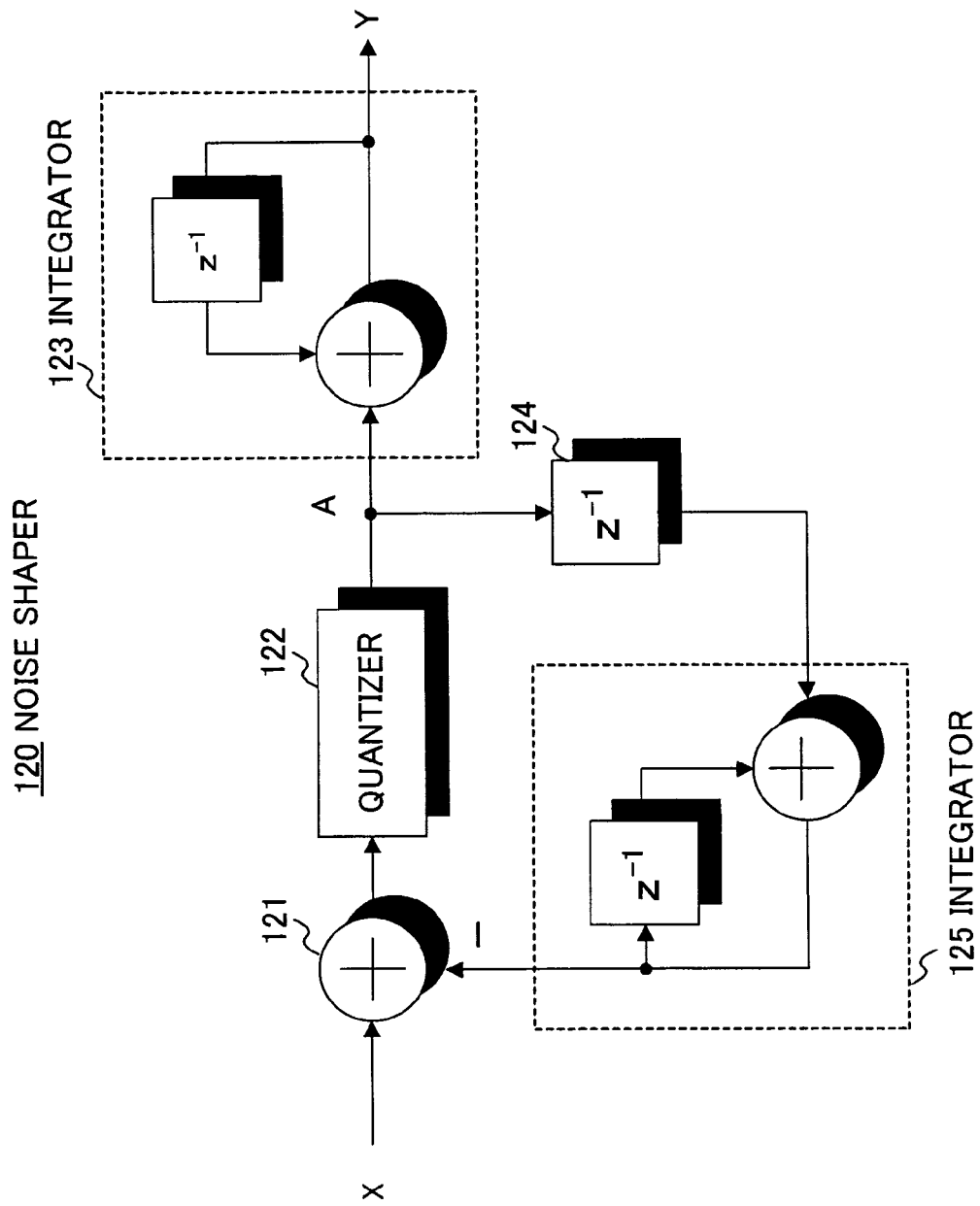
FIG. 12 is a block diagram showing a configuration of a noise shaper according to Embodiment 3 of the present invention.

The present embodiment proposes the use of a delta modulator having the configuration shown in FIG. 12 as a noise shaper. Noise shaper 120 is used in frequency modulation apparatus 100 in place of noise shaper 101 of FIG. 4.

Similar to noise shaper 101 and noise shaper 110 of Embodiment 1 and Embodiment 2, respectively, noise shaper 120 has the function of shaping analogue voltage values in accordance with modulation data and the function of changing the frequency characteristics of the quantization noise that appears then. However, the method of changing the frequency characteristics of quantization noise is different from those of Embodiment 1 and Embodiment 2.

Noise shaper 120 inputs modulation data in quantizer 122 via subtractor 121. Quantizer 122 quantizes the input signal at a sampling frequency at least double the sampling frequency of the modulation data and obtains an analogue voltage. In fact, quantizer 122 is designed to perform quantization at a sampling frequency several tens of times the sampling frequency of the modulation data and obtain the analogue voltage. The analogue voltage obtained in quantizer 122 is integrated in integrator 123 and thereby becomes analogue output voltage Y. The output of quantizer 122 is fed back as a subtraction input to subtractor 121, via delay element 124, which delays the output by the time of $z^{-1}$, and integrator 125 sequentially.

Next, the operation and characteristics of noise shaper 120 and frequency modulation apparatus 120 using this noise shaper 120 will be described. The transfer frequency of integrators 123 and 125 can be expressed as $1/(1-z^{-1})$. Now, if the signal level at point A in FIG. 12 is A and the quantization noise that is produced in quantizer 122 is Q, the following formula holds:

$$A = X - z^{-1}A/(1-z^{-1}) + Q$$

$$A = (1-z^{-1})(X+Q) \quad (5)$$

In accordance with this, analogue output voltage Y of noise shaper 120 can be expressed by the following formula:

$$Y = A/(1-z^{-1})$$

$$Y = X + Q \quad (6)$$

As represented in formula (6), quantization noise Q is added to input signal X and the result is the output. However, as represented in formula (5), at point A, input signal A and quantization noise Q are differentiated and the resulting signal appears. This means that the DC component of input signal X does not communicate to the output.

Figure 13:
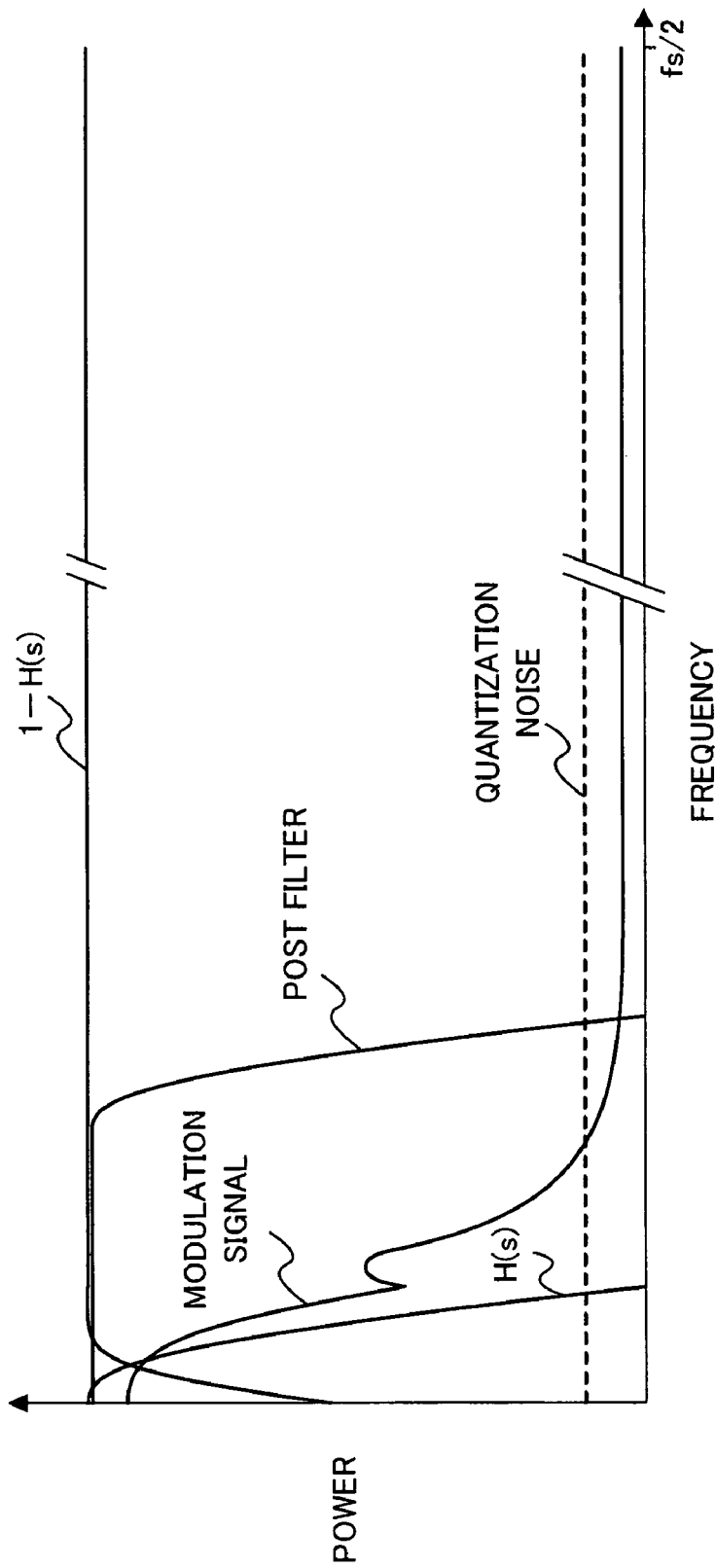
FIG. 13 shows a characteristic curve of baseband signal spectrum according to Embodiment 3.

FIG. 13 shows frequency characteristics in baseband area of a frequency modulation apparatus using noise shaper 120 of the present embodiment. That quantization noise Q is distributed evenly, in both FIG. 2 and in FIG. 13. However, as shown in FIG. 13, by increasing the operation frequency of noise shaper 120, the absolute level of quantization noise can be decreased.

Figure 14:
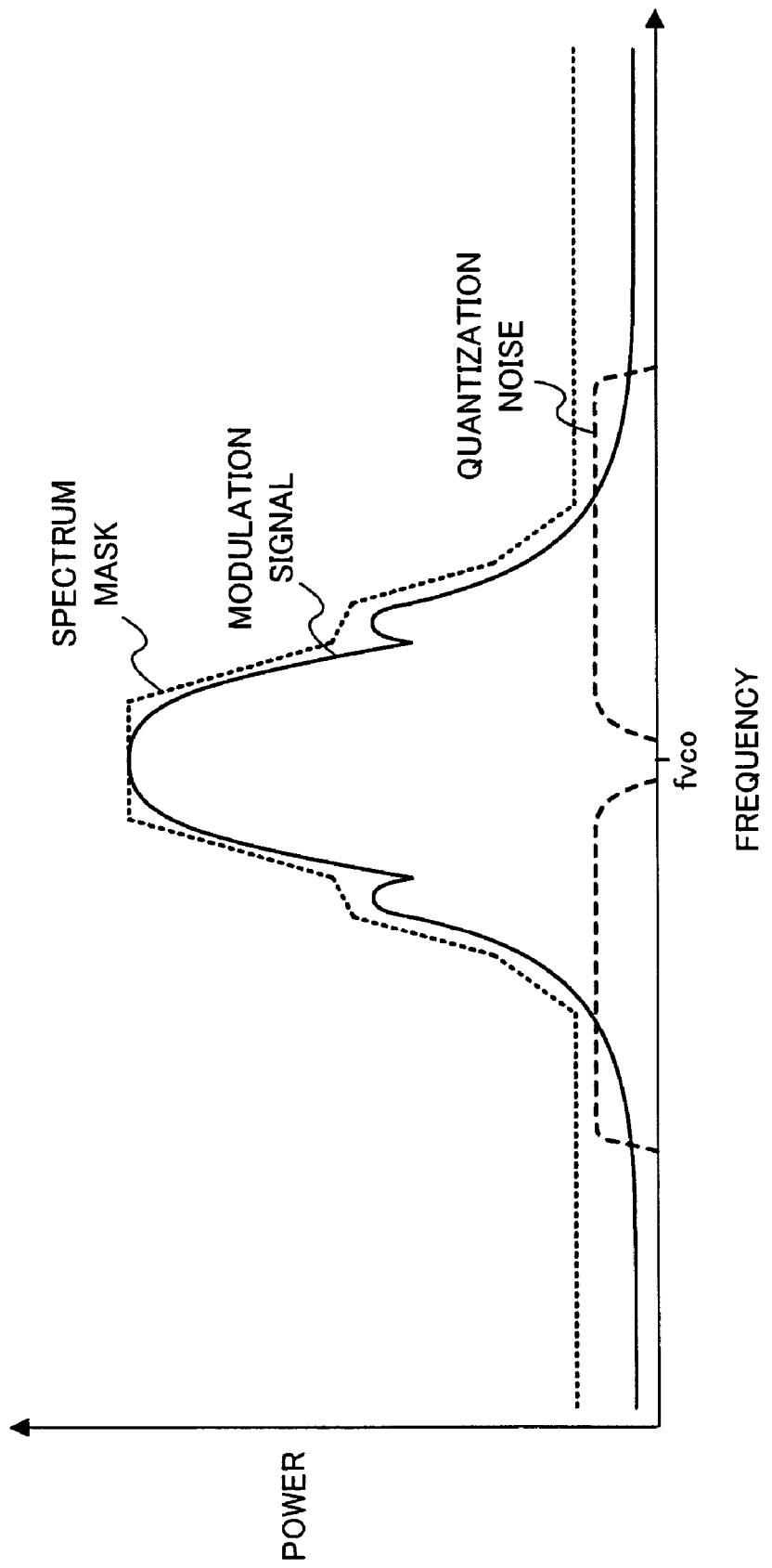
FIG. 14 shows a characteristic curve of RF signal spectrum according to Embodiment 3.

FIG. 14 shows the spectrum of RF modulation signal outputted from VCO 1. Quantization noise Q is superimposed upon the modulation signal and the resulting waveform is outputted from VCO 1. As shown in FIG. 14, compared to FIG. 3, quantization noise Q that is superimposed upon the modulation signal has lower noise levels at far points from center frequency $f_{VCO}$, by the working of noise shaper 120. This fulfills the requirement of the spectrum mask.

The delta modulator used as noise shaper 120 of the present embodiment can implement a one-bit quantizer, and so it is not necessary to use a multiple-bit quantizer such as in conventional D/A convertor 6 shown in FIG. 1. Incidentally, a one-bit quantizer is applicable to quantizers 103 and 113 of Embodiments 1 and 2 as well. This makes possible high accuracy signal processing. Applying this delta modulator to the two-point modulation PLL has the advantage of improving the modulation accuracy of RF modulation signals. Although the delta modulator has the disadvantage of blocking DC components, a pass filter having pass characteristics of {1−H(s)} of the two-point modulation PLL basically blocks DC components, so that, in the overall two-point modulation PLL system, the above disadvantage does not count.

According to the present embodiment, thus, voltage is supplied to the control voltage terminal of VCO 1 in accordance with modulation data via noise shaper 120 comprised of a delta modulator configuration. By this means, the present embodiment makes possible two-point frequency modulation apparatus 100 that keeps the spectrum of transmission waves within the spectrum mask.

Although a case has been described above with the present embodiment where a delta modulator having an order of degree one is used as noise shaper 120, it is possible to set an order of degree two and greater in the delta modulator.

Embodiment 4

The present embodiment proposes applying frequency modulation apparatus 100, which is explained in Embodiment 1 to 3, to a polar modulation transmission apparatus.

Figure 15:
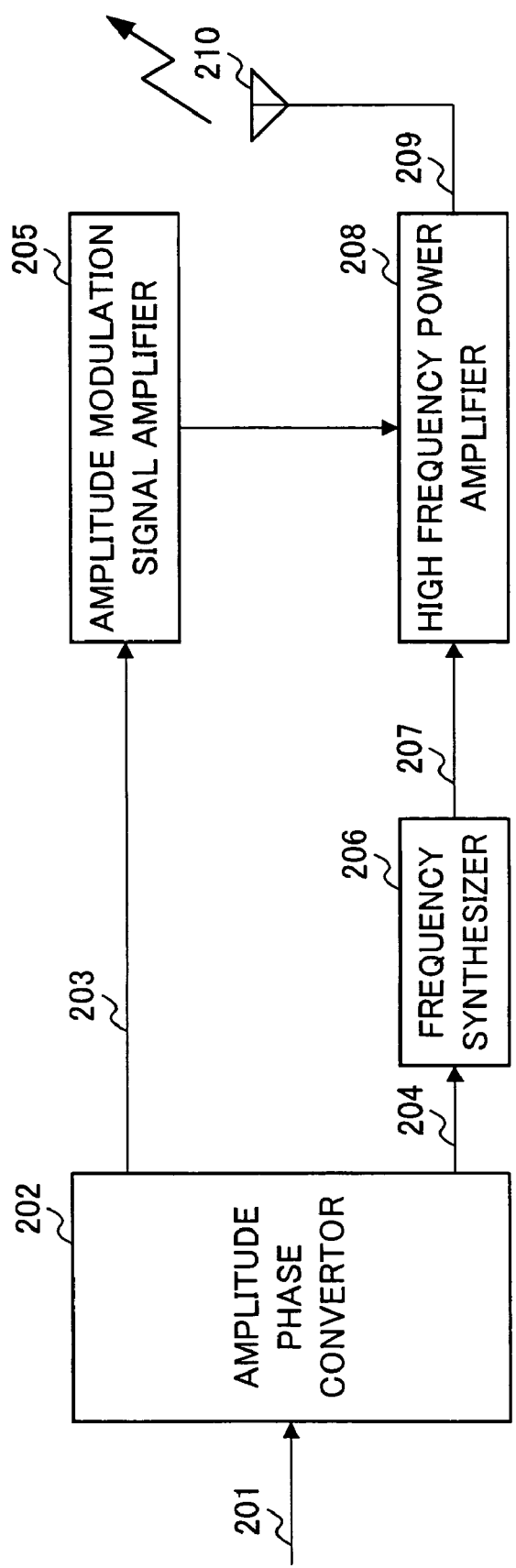
FIG. 15 is a block diagram showing a configuration of a wireless communication apparatus according to Embodiment 4 of the present invention.

FIG. 15 shows the configuration of polar modulation transmission apparatus of the present embodiment. Frequency modulation apparatus 100 is used as frequency synthesizer 206 in the drawing. Incidentally, FIG. 15 shows only surrounding parts around frequency synthesizer 206 where frequency modulation apparatus 100 is used.

Polar modulation transmission apparatus 200 inputs baseband modulation signal 201 formed with the I (In-phase) component and Q (Quadrature) component to amplitude phase convertor 202. Amplitude phase convertor 202 sends the amplitude component of baseband modulation signal 201 (that is, $\sqrt{(I^2+Q^2)}$) to amplitude modulation signal amplifier 205 as amplitude modulation signal 203, and, likewise, sends the phase component of baseband modulation signal 201 (for example, the angle of a modulation symbol with respect to the I axis) to frequency synthesizer 206 as baseband phase modulation signal 204.

In this polar modulation transmission apparatus 200, frequency modulation apparatus 100 of above-described Embodiment 1, Embodiment 2 or Embodiment 3 is used as frequency synthesizer 206. In addition, baseband phase modulation signal 204 corresponds to the modulation data in Embodiment 1, Embodiment 2, or Embodiment 3 above.

Frequency synthesizer 206 modulates the carrier frequency by baseband phase modulation signal (phase data) 204 and thereby generates high frequency phase modulation signal (RF modulation signal) 207, and sends this signal to high frequency power amplifier 208.

High frequency power amplifier 208 is comprised of a non-linear amplifier and is designed such that the source voltage level is set in accordance with amplitude modulation signal 203 that is amplified in phase modulation signal amplifier 205. By this means, the source voltage value and high frequency phase modulation signal 207 outputted from frequency synthesizer 206, are multiplied, and the resulting signal is amplified by the gain in high frequency power amplifier 208 and is outputted from high frequency power amplifier as transmission signal 209. Transmission signal 209 is transmitted from antenna 210.

Thus, polar modulation transmission apparatus 200 makes it possible to make high frequency phase modulation signal 207 that is inputted in high frequency power amplifier 208 a constant envelope signal having no varying components in amplitude directions, thereby being able to utilize a high efficiency non-linear amplifier as high frequency power amplifier 208.

In addition, by using frequency modulation apparatus 100 of Embodiment 1, Embodiment 2, or Embodiment 3 above for frequency synthesizer 206 of polar modulation transmission apparatus 200, the present embodiment makes it possible to obtain transmission signal 209 in which the quantization noise is kept within the spectrum mask. As a result, in addition to the advantage of improving power efficiency by means of the polar modulation scheme and the advantage of improving the modulation accuracy by means of two-point modulation, the present embodiment makes possible polar modulation transmission apparatus 200 that dependably keeps transmission waves within the spectrum mask.

Other Embodiments

Although a case has been described above with Embodiment 4 where frequency modulation apparatus 100 of Embodiments 1 to 3 is utilized as frequency synthesizer 206 provided in polar modulation transmission apparatus 200, the frequency modulation apparatus of the present invention is by no means limited to this and is widely applicable to wireless transmission apparatus and wireless communication apparatus that needs to keep the bandwidth of a transmission signal within a certain frequency bandwidth.

Figure 16:
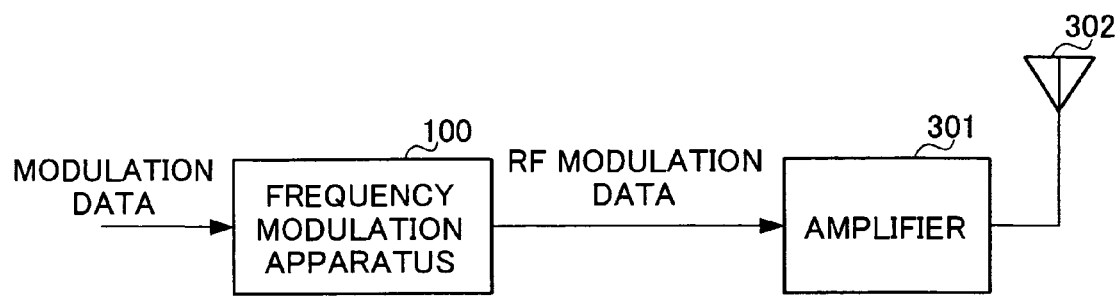
FIG. 16 is a block diagram showing a configuration of a wireless transmission apparatus according to another embodiment of the present invention.

FIG. 16 shows the configuration of a wireless transmission apparatus having the frequency modulation apparatus of one of Embodiments 1 to 3. Wireless transmission apparatus 300 has frequency modulation apparatus 100 according one of Embodiments 1 to 3, amplifier 301 that amplifies an RF modulation signal obtained in frequency modulation apparatus 100, and antenna 302 that transmits the amplified signal.

Figure 17:
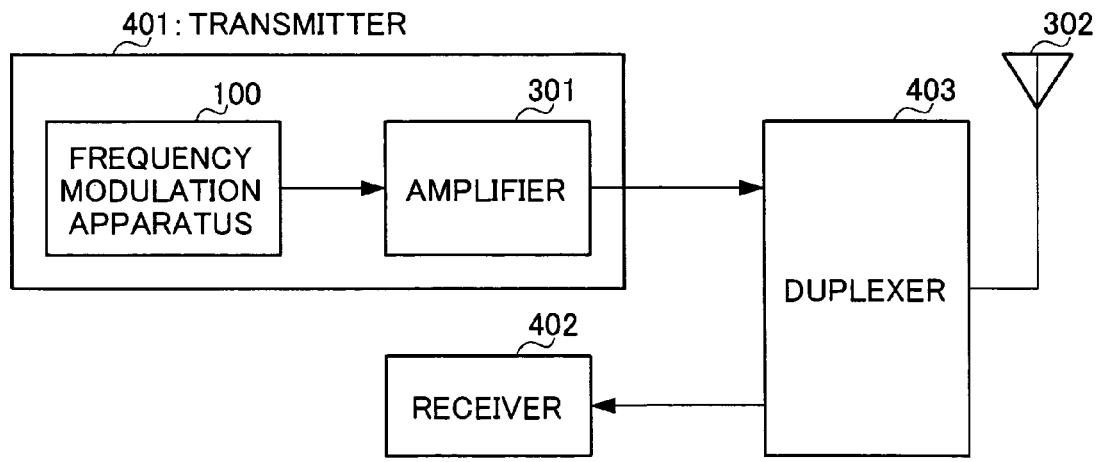
FIG. 17 is a block diagram showing a configuration of a wireless communication apparatus according to another embodiment of the present invention.

FIG. 17 shows the configuration of a wireless communication apparatus provided with the frequency modulation apparatus of one of Embodiments 1 to 3. Wireless communication apparatus 400 has: transmitter 401 that has frequency modulation apparatus 100 of one of Embodiments 1 to 3 and amplifier 301; receiver 402 that performs predetermined receiving processing of a signal including demodulation processing; duplexer 403 that performs switching control between transmission signal and receiving signal; and antenna 302.

By this means, wireless transmission apparatus 300 and wireless communication apparatus 400 can obtain high quality transmission signals because wireless transmission apparatus 300 and wireless communication apparatus 400 can perform high accuracy frequency modulation using two-point modulation. Furthermore wireless transmission apparatus 300 and wireless communication apparatus 400 can suppress interference against other wireless equipments because wireless transmission apparatus 300 and wireless communication apparatus 400 can keep transmission waves within the spectrum mask.

Thus, as described above, in accordance with one aspect of the frequency modulation apparatus of the present invention, there is provided a configuration comprising: a PLL circuit; a frequency divider that is provided in the PLL circuit and determines a frequency division ratio in the PLL circuit based on a baseband modulation signal and a carrier frequency signal; an adder that is provided in the PLL circuit between a loop filter and a voltage controlled oscillator and adds voltage according to the baseband modulation signal to output voltage of the loop filter and supplies the output voltage of the loop filter to a control voltage terminal of the voltage controlled oscillator; and a noise shaper that changes frequency characteristics of quantization noise that appears when the baseband modulation signal is analogue converted and supplied to the adder.

By virtue of the above configuration, the two-point frequency modulation apparatus of the present invention is able to change the frequency characteristics of quantization noise that appears upon forming the voltage to supply to the control voltage terminal of the voltage controlled oscillator by means of the noise shaper, thereby making it readily possible to keep transmission waves containing the quantization noise within the spectrum mask.

In accordance with another aspect of the frequency modulation apparatus of the present invention, there is provided a configuration wherein the noise shaper attenuates more noise at higher frequencies.

By virtue of the above configuration, the signal level combining the modulation signal outputted from the PLL circuit and the quantization noise decreases in proportion to the distance from the center frequency, so that it is readily possible to keep transmission waves within the spectrum mask. The low frequency component of the quantization noise can be suppressed by the characteristics of the PLL circuit and does not cause any serious problems.

In accordance with yet another aspect of the frequency modulation apparatus of the present invention, there is provided a configuration wherein the noise shaper has a transfer function which is obtained by adding an integration result of the quantization noise to the baseband signal.

By virtue of the above configuration, the quantization noise after integration has low pass characteristics, so that it is readily possible to attenuate more quantization noise at higher frequencies and keep transmission waves containing the quantization noise within the spectrum mask.

In accordance with yet another aspect of the frequency modulation apparatus of the present invention, there is provided a configuration wherein the noise shaper has: a differentiator that differentiates the baseband modulation signal; a quantizer; and a feedback circuit that synchronizes a timing of an output signal of the differentiator and an output signal of the quantizer, adds the outputs signals so as to input an addition signal to the quantizer.

By virtue of the above configuration, it is made possible to make the transfer function of the noise shaper equal to a result of adding integrated quantization noise to the baseband modulation signal.

In accordance with yet another aspect of the frequency modulation apparatus of the present invention, there is provided a configuration wherein the noise shaper comprises a bandpass delta sigma modulator.

By virtue of the above configuration, the quantization noise of certain frequencies can be suppressed, so that, by combining characteristics of other filters (post filter, for example), it is readily possible to prevent transmission waves from leaking out of the spectrum mask.

In accordance with yet another aspect of the frequency modulation apparatus of the present invention, there is provided a configuration wherein the noise shaper comprises a delta modulator.

By virtue of the above configuration, by increasing the operation frequency, the delta modulator is able to decrease the absolute level of the quantization noise that appears in the output, so that it is readily possible to keep transmission waves containing the quantization noise within the spectrum mask.

In accordance with yet another aspect of the frequency modulation apparatus of the present invention, there is provided a configuration wherein a low pass filter is further provided between the noise shaper and the adder.

By virtue of the above configuration, signals of high frequency bandwidth can be suppressed by means of the low pass filter (post filter, for example), while the frequency characteristics of the quantization noise are changed by means of the noise shaper, so that it is readily possible to keep transmission waves containing the quantization noise within the spectrum mask. For example, by suppressing the high frequency component of the quantization noise by means of the noise shaper, it becomes unnecessary to narrow the low pass characteristics of the low pass filter to such a level where the modulation signal waveform with respect to the baseband modulation signal is suppressed. As a result, it is possible to maintain the modulation signal waveform and keep transmission waves containing the quantization noise within the spectrum mask.

In accordance with one aspect of the polar modulation transmission apparatus of the present invention, there is provided a configuration comprising: an amplitude phase convertor that forms a baseband phase modulation signal and a baseband amplitude modulation signal on the based on a baseband modulation signal; a PLL circuit that receives as input the baseband phase modulation signal and outputs an RF phase modulation signal; a high frequency power amplifier that changes an amplitude of the RF phase modulation signal outputted from a voltage controlled oscillator of the PLL circuit in accordance with the amplitude modulation signal; a frequency divider that is provided in the PLL circuit and sets a frequency division ratio in the PLL circuit based on the baseband phase modulation signal and a carrier frequency signal; an adder that is provided in the PLL circuit between a loop filter and a voltage controlled oscillator and adds voltage according to the baseband modulation signal to output voltage of the loop filter and supplies the output voltage of the loop filter to a control voltage terminal of the voltage controlled oscillator; and a noise shaper that changes frequency characteristics of quantization noise that appears when the baseband modulation signal is analogue converted and supplied to the adder.

By virtue of the above configuration, a two-point polar modulation transmission apparatus that prevents transmission waves from going beyond the spectrum mask due to the influence of the quantization noise, is made possible. As a result, in addition to the advantage of improving power efficiency by means of the polar modulation method and the advantage of improving the modulation accuracy by means of two-point modulation, a polar modulation transmission apparatus that dependably keeps transmission waves within the spectrum mask is made possible.

In accordance with one aspect of the wireless transmission apparatus of the present invention, there is provided a configuration comprising: a frequency modulation apparatus of one of the configurations described above; and an amplifier that amplifies an RF modulation signal outputted from the frequency modulation apparatus.

In accordance with one aspect of the wireless communication apparatus of the present invention, there is provided a configuration comprising: a transmitter having a frequency modulation apparatus having one of the configurations described above; a receiver that demodulates a received signal; an antenna; and a transmission and reception switch that switches between supplying a transmission signal from the transmitter to the antenna and supplying the received signal from the antenna to the receiver.

By virtue of these configurations, the wireless transmission apparatus and wireless communication apparatus can obtain high quality transmission signals because the wireless transmission apparatus and the wireless communication apparatus can perform high accuracy frequency modulation using two-point modulation. Furthermore the wireless transmission apparatus and the wireless communication apparatus can suppress interference against other wireless equipments because the wireless transmission apparatus and wireless communication apparatus can keep transmission waves within the spectrum mask.

The present invention is not limited to the above described embodiments, and various variations and modifications may be possible without departing from the scope of the present invention.

This application is based on Japanese Patent Application No. 2004-71292, filed on Mar. 12, 2004, the entire content of which is expressly incorporated by reference herein.

What is claimed is:

1. A frequency modulation apparatus comprising:
   a Phase Locked Loop (PLL) circuit;
   a frequency divider that is provided in the PLL circuit and determines a frequency division ratio in the PLL circuit based on a digital baseband modulation signal and a carrier frequency signal;
   an adder that is provided in the PLL circuit between a loop filter and a voltage controlled oscillator, inputs an output signal of the loop filter to a first adder input terminal, inputs a signal obtained by analog converting the digital baseband modulation signal, to a second adder input terminal, and outputs an added output to the voltage controlled oscillator; and
   a noise shaper that includes:
      a differentiator that differentiates the digital baseband modulation signal;
      a quantizer that is provided after the differentiator and outputs a signal obtained by quantizing an input signal;
      a feedback circuit that is provided parallel to the quantizer after the differentiator and inputs a signal obtained by adding the signal outputted from the quantizer and a signal outputted from the differentiator, to the quantizer;
      the differentiator, quantizer and feedback circuit cooperating to generate an analog signal, which is provided to the second adder input terminal, comprising the sum of: (1) the quantization noise, produced by the quantizer, multiplied by an integration transfer function whereby the quantization noise increases infinitely at or near a frequency zero and the quantization noise is attenuated in higher frequency domain, (2) the digital base band modulation signal, after conversion to analog form; and
   a post filter that is provided between the noise shaper and the adder and allows to pass only a low frequency component of the analog voltage signal outputted from the noise shaper.

2. A polar modulation transmission apparatus comprising:
   an amplitude phase converter that forms a baseband phase modulation signal and a baseband amplitude modulation signal based on a digital baseband modulation signal;
   a Phase Locked Loop (PLL) circuit that receives as input the baseband phase modulation signal and outputs an Radio Frequency (RF) phase modulation signal;
   a high frequency power amplifier that changes an amplitude of the RF phase modulation signal outputted from a voltage controlled oscillator of the PLL circuit in accordance with the amplitude modulation signal;
   a frequency divider that is provided in the PLL circuit and sets a frequency division ratio in the PLL circuit based on the baseband phase modulation signal and a carrier frequency signal;
   an adder that is provided in the PLL circuit between a loop filter and a voltage controlled oscillator, inputs an output signal of the loop filter to a first adder input terminal, inputs a signal obtained by analog converting the baseband phase modulation signal, to a second adder input terminal, and outputs an added output to the voltage controlled oscillator; and a noise shaper that includes:
- a differentiator that differentiates the digital baseband modulation signal;
- a quantizer that is provided after the differentiator and outputs a signal obtained by quantizing an input signal;

a feedback circuit that is provided parallel to the quantizer after the differentiator and inputs a signal obtained by adding the signal outputted from the quantizer and a signal outputted from the differentiator, to the quantizer;

the differentiator, quantizer and feedback circuit cooperating to generate an analog signal, which is provided to the second adder input terminal, comprising the sum of: (1) the quantization noise, produced by the quantizer, multiplied by an integration transfer function whereby the quantization noise increases infinitely at or near a frequency zero and the quantization noise is attenuated in higher frequency domain, (2) the digital base band modulation signal after conversion to analog form; and a post filter that is provided between the noise shaper and the adder and allows to pass only a low frequency component of the analog voltage signal outputted from the noise shaper.

3. A wireless transmission apparatus comprising:

the frequency modulation apparatus of claim 1; and an amplifier that amplifies an RF modulation signal outputted from the frequency modulation apparatus.

4. A wireless communication apparatus comprising:

a transmitter having the frequency modulation apparatus of claim 1;

a receiver that demodulates a received signal;

an antenna; and a transmission and reception switch that switches between supplying a transmission signal from the transmitter to the antenna and supplying the received signal from the antenna to the receiver.

5. A frequency modulation apparatus comprising:

a Phase Locked Loop (PLL) circuit that includes:
- a frequency divider that sets a frequency division ratio based on a baseband modulation signal and a carrier frequency signal, and performs frequency division of an Radio Frequency (RF) modulation signal that is received as input based on the frequency division ratio;
- a phase comparator that compares the phase of a frequency division signal outputted from the frequency divider and a reference signal, and outputs a signal matching a phase difference;
- a loop filter that averages the signal outputted from the phase comparator;
- an adder that adds an analog voltage signal obtained by analog converting the baseband modulation signal to an output signal of the loop filter, and outputs an addition signal; and
- a voltage controlled oscillator that receives as input the addition signal, and outputs an RF modulation signal having an oscillation frequency matching a signal received as input, and that inputs the RF modulation signal outputted from the voltage controlled oscillator to the frequency divider;

a noise shaper that includes:
- a differentiator that differentiates the digital baseband modulation signal;
- a quantizer that is provided after the differentiator and outputs a signal obtained by quantizing an input signal;
- a feedback circuit that is provided parallel to the quantizer after the differentiator and inputs a signal obtained by adding the signal outputted from the quantizer and a signal outputted from the differentiator, to the quantizer;

the differentiator, quantizer and feedback circuit cooperating to generate an analog signal, which is provided to the second adder input terminal, comprising the sum of (1) the quantization noise, produced by the quantizer, multiplied by an integration transfer function whereby the quantization noise increases infinitely at or near a frequency zero and the quantization noise is attenuated in higher frequency domain, (2) the digital base band modulation signal, after conversion to analog form; and a post filter that is provided between the noise shaper and the adder and allows to pass only a low frequency component of the analog voltage signal outputted from the noise shaper.

6. A polar modulation transmission apparatus comprising:

the frequency modulation apparatus of claim 5;

an amplitude phase converter that is provided before the frequency modulation apparatus, forms a phase modulation signal and an amplitude modulation signal based on a modulation signal that is received as input, and outputs the phase modulation signal to the frequency modulation apparatus as a baseband modulation signal;

an amplitude modulation signal amplifier that is provided parallel to the frequency modulation apparatus after the amplitude phase converter, amplifies the amplitude modulation signal, and outputs the amplified amplitude modulation signal; and an amplifier that amplifies an RF modulation signal outputted from a voltage controlled oscillator included in the frequency modulation apparatus, based on a source voltage set according to the amplified amplitude modulation signal outputted from the amplitude modulation signal amplifier.

* * * * *

UNITED STATES PATENT AND TRADEMARK OFFICE
CERTIFICATE OF CORRECTION

PATENT NO. : 7,706,495 B2
APPLICATION NO. : 11/078701
DATED : April 27, 2010
INVENTOR(S) : Shunsuke Hirano et al.

It is certified that error appears in the above-identified patent and that said Letters Patent is hereby corrected as shown below:

Claim 1, column 12, line 22 of the Letters Patent which issued on April 27, 2010, incorrectly reads "controlled oscillator; and"
and should read:
"controlled oscillator"

Claim 2, column 13, line 22 of the Letters Patent which issued on April 27, 2010, incorrectly reads "modulation signal after conversion to analog form; and"
and should read:
"modulation signal, after conversion to analog form; and"

Claim 5, column 14, line 24 of the Letters Patent which issued on April 27, 2010, incorrectly reads "the sum of (1) the quantization noise, produced by the"
and should read:
"the sum of: (1) the quantization noise, produced by the"

Signed and Sealed this

Twenty-first Day of December, 2010

David J. Kappos
*Director of the United States Patent and Trademark Office*